United States Patent [19]
Yokomizo

[11] Patent Number: 5,301,158
[45] Date of Patent: Apr. 5, 1994

[54] DATA READING CIRCUIT INCLUDING A CURRENT SENSING AMPLIFIER CIRCUIT

[75] Inventor: Koichi Yokomizo, Tokyo, Japan

[73] Assignee: Oki Electric Industry Co., Ltd., Tokyo, Japan

[21] Appl. No.: 33,234

[22] Filed: Mar. 16, 1993

[30] Foreign Application Priority Data

Mar. 16, 1992 [JP] Japan ................... 4-058488

[51] Int. Cl.$^5$ .................. G11C 13/00; H03K 5/24
[52] U.S. Cl. ......................... 365/205; 365/206; 365/207; 307/279; 307/530
[58] Field of Search ........... 365/205, 206, 207, 208; 307/530, 279, 475

[56] References Cited

U.S. PATENT DOCUMENTS

| | | | |
|---|---|---|---|
| 4,415,995 | 11/1983 | Glock | 365/190 |
| 4,553,053 | 11/1985 | Ong et al. | 365/208 X |
| 4,604,533 | 8/1986 | Miyamoto et al. | 307/530 |
| 4,618,785 | 10/1986 | Van Tran | 307/530 |
| 4,991,141 | 2/1991 | Tran | 365/207 |
| 5,204,838 | 4/1993 | Son et al. | 365/203 |

FOREIGN PATENT DOCUMENTS

3-185698  8/1991  Japan .

OTHER PUBLICATIONS

Data-Line Wiring Delay Reduction Techniques for High-Speed BiCMOS SRAM's, 1991 Symposium on VLSI Circuits—Digest of Technical Papers, Y. Urakawa, M. Matsui, A. Suzuki, H. Kato, T. Hamano, K. Sato, T. Ohtani, K. Ochii, May 1991, pp. 19–20.

Primary Examiner—Eugene R. LaRoche
Assistant Examiner—Son Dinh
Attorney, Agent, or Firm—Edward D. Manzo

[57] ABSTRACT

A data reading circuit comprising a first data line to which a first current signal having a first current value is supplied, a second data line to which a second current signal having a second current value is supplied, a current-voltage converter circuit connected between the first and second nodes for applying a first voltage potential difference, which corresponds to the difference between the first and second current values, between the first and the second nodes, a first node, a second node, a level shifting circuit connected between the first and second nodes and the third and fourth nodes for applying a second voltage potential difference, which is substantially equal to the first voltage potential difference in response to the same, between the third and fourth nodes and a feedback circuit connected between the first and second nodes and the third and fourth nodes for applying a third voltage potential difference, which is larger than the first voltage potential difference, between the first and second nodes in response to a first control signal.

11 Claims, 2 Drawing Sheets

DATA READING CIRCUIT INCLUDING A CURRENT SENSING AMPLIFIER CIRCUIT

CROSS REFERENCE TO RELATED APPLICATION

This application claims the priority of Japanese Patent Application Serial No. 4-58,488, filed Mar. 16, 1992, the subject matter of which is incorporated herein by reference.

BACKGROUND OF THE INVENTION

1. Field of the Invention

The present invention relates to a data reading circuit including a current sensing amplifier circuit for reading out data stored in memory cells.

2. Description of the Related Art

The current sensing amplifier circuit is used, for example, in a bipolar-CMOS type static random access memory (referred to as a BiCMOS-type SRAM hereinafter).

The BiCMOS-type SRAM comprises memory cells composed of N-type MOS FETs and high resistance loads, and a data reading circuit composed of bipolar transistors and CMOS-type FETs (Complementary MOS FETs).

The data reading circuit of the BiCMOS-type SRAM includes a current sensing type current sensing amplifier circuit for shortening the data reading time.

The technique relating to the data reading circuit of the BiCMOS-type SRAM is disclosed, for instance, in a circuit illustrated in FIG. 2. The circuit in FIG. 2 exemplifies a data reading circuit including a current sensing amplifier circuit.

The data reading circuit illustrated in FIG. 2 comprises four first sensing amplifiers SA11 to SA14 connected to a pair of common data lines DL and $\overline{DL}$ and four pairs of bit lines BL11, $\overline{BL11}$ to BL14, $\overline{BL14}$, a current sensing amplifier circuit CSA connected to the pair of common data lines DL and $\overline{DL}$, a second sensing amplifier SA2 connected to the current sensing amplifier circuit CSA and a third sensing amplifier SA3 connected between the second sensing amplifier SA2 and output terminals DO and $\overline{DO}$.

The four pairs of the bit lines are connected to four first sensing amplifiers SA11 to SA14 respectively at one ends thereof, while to a plurality of memory cells MCs directly or by way of switches at the other ends thereof respectively.

A memory cell MC stores therein a data represented by a pair of electric signals which are complementary to each other. A data stored in the memory cells is read out into a pair of bit lines in response to a selection signal supplied from a selection circuit, not shown. Since the data is represented by a pair of electric signals which are complementary to each other, for example, a bit line B11 goes high while the other bit line $\overline{BL11}$ goes low. That is, a voltage potential difference is generated between the pair of bit lines (between the bit line B11 and the other bit line $\overline{BL11}$).

The first sensing amplifier SA11 converts the complementary voltage signals of the pair of bit lines into complementary current signals and supplies the same to the pair of common data lines DL and $\overline{DL}$.

The complementary current signals supplied to the pair of common data lines DL and $\overline{DL}$ are further supplied to the current sensing amplifier circuit CSA.

The current sensing circuit CSA converts the complementary current signals into complementary voltage signals. The voltage amplitude between the complementary voltage signals is about 300 mV in case of a 1M bit class BiCMOS-type SRAM.

The complementary voltage signals converted by the current sensing circuit CSA are amplified by the second sensing amplifier SA2 and are supplied to the third sensing amplifier SA3. The voltage amplitude between the voltage signals supplied to the third sensing amplifier SA3 is about 800 mV. That is, the voltage amplitude between the voltage signals supplied from the second amplifier SA2 is greater than that supplied from the current sensing amplifier circuit CSA.

The voltage signals supplied from the second sensing amplifier SA2 are amplified to CMOS logical level (about 5 V in voltage amplitude) and are output from output terminals DO and $\overline{DO}$.

Thus the voltage signals having a voltage amplitude of about 300 mV produced by the current sensing amplifier circuit CSA are finally amplified to CMOS level voltage signals having a voltage amplitude of about 5 V.

The data reading circuit illustrated in FIG. 2 shortens the reading time of data by keeping the voltage potentials of the data lines DL and $\overline{DL}$ at a given level. In order to keep the voltage potentials of the data lines DL and $\overline{DL}$ at a given level, it is necessary to reduce the voltage amplitude between the voltage signals produced by the current sensing amplifier circuit CSA. (approximately less than 300 mV in case of 1 Mb BiCMOS-type SRAM).

On the other hand, the data reading circuit needs the third sensing amplifier SA3 for amplifying the voltage signals produced by the current sensing amplifier circuit CSA to the CMOS logical level in order to obtain the necessary CMOS level voltage signals finally. However, the voltage signals supplied to the third sensing amplifier SA3 need to be large in amplitude in order to quicken the operation of the third sensing amplifier SA3 (approximately more than 800 mV in case of 1 Mb BiCMOS-type SRAM). Accordingly, the data reading circuit needs the second sensing amplifier SA2 for amplifying the voltage signals produced by the current sensing amplifier circuit CSA.

SUMMARY OF THE INVENTION

It is an object of the present invention to provide a data reading circuit which takes less time in reading data.

It is the other object of the present invention to provide a data reading circuit having less number of circuit elements.

In order to attain the above objects, the present invention provides a data reading circuit comprising a first data line to which a first current signal having a first current value is supplied, a second data line to which a second current signal having a second current value is supplied, a current-voltage converter circuit connected between a first node and a second node for applying a first voltage potential difference, corresponding to the difference between the first and second current values, between the first and second nodes, a level shifting circuit connected between the first and second nodes and a third and a fourth node for applying a second voltage potential difference, which is substantially equal to the first voltage potential difference in response to the same, between the third and the fourth nodes and a feedback circuit connected between the first and second nodes and the third and fourth nodes for applying the third voltage potential difference larger than the first voltage potential difference between the first node and the second node in response to a first control signal.

DETAILED EMBODIMENT OF THE INVENTION

A data reading circuit according to a first embodiment of the present invention will be described hereinafter with reference to FIG. 1.

Figure 1:
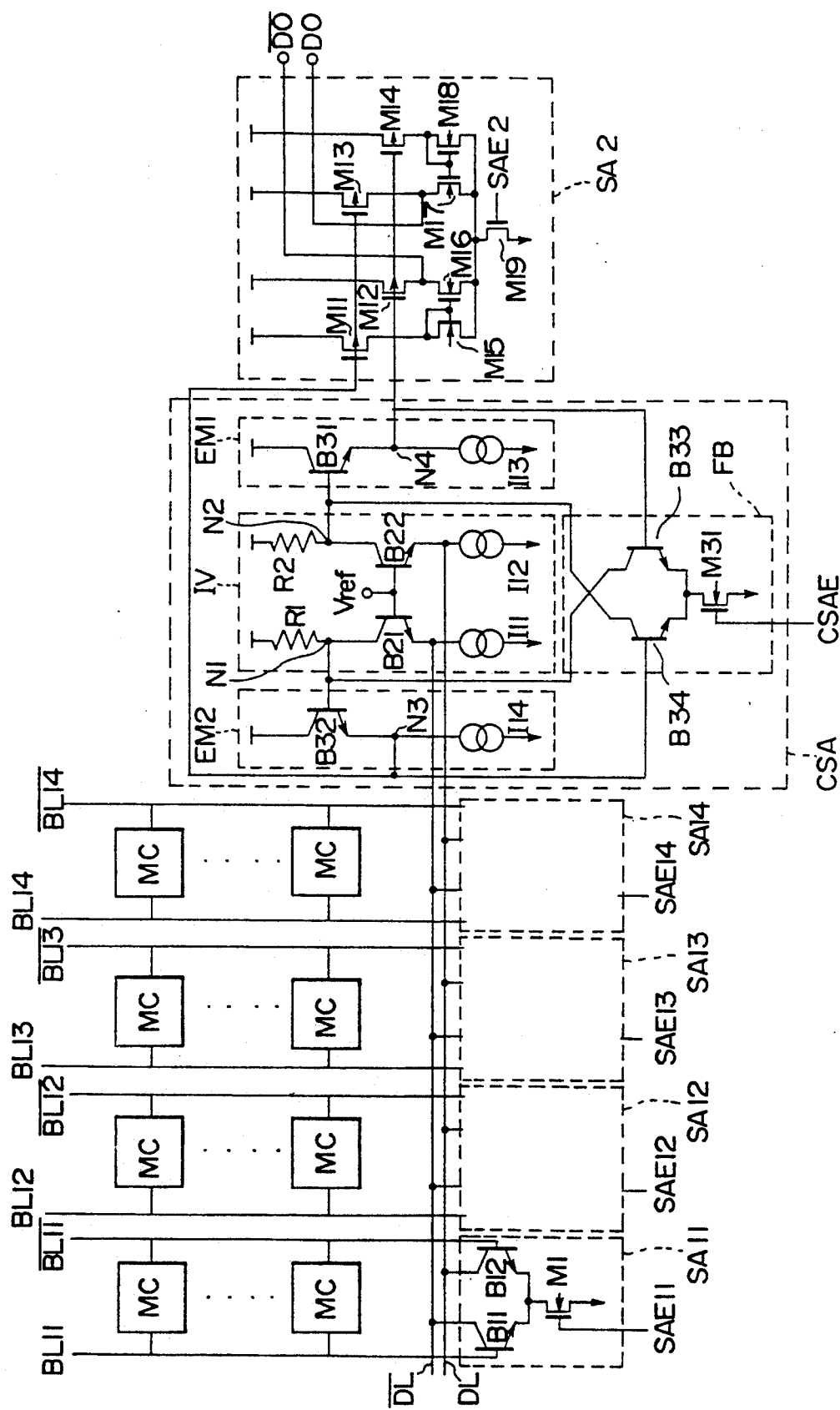
FIG. 1 is a circuit diagram of a data reading circuit according to a first embodiment of the present invention.
Figure 2:
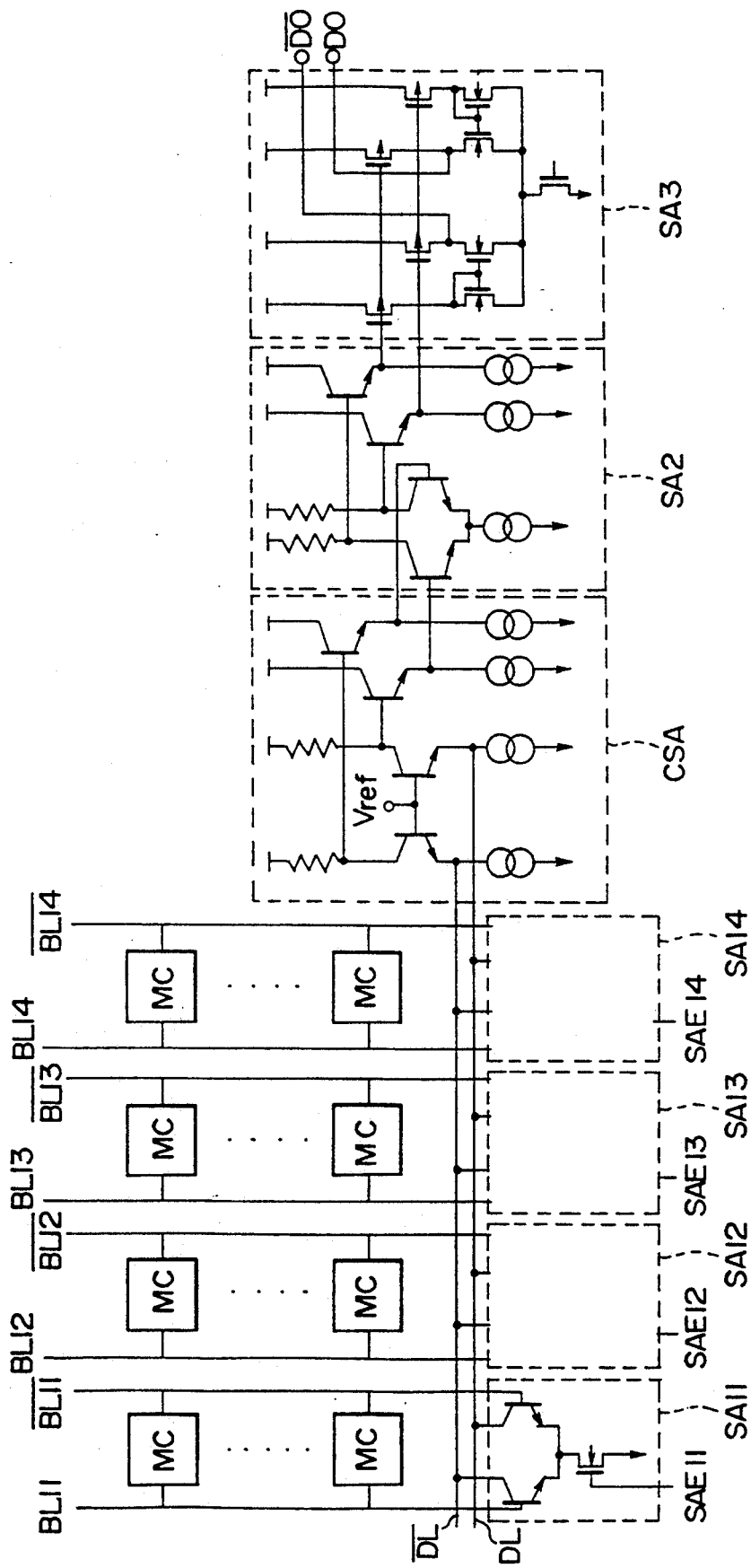
FIG. 2 is a circuit diagram of a conventional data reading circuit.

FIG. 1 is a circuit diagram of the data reading circuit according to the first embodiment of the present invention.

The data reading circuit illustrated in FIG. 1 comprises four first sensing amplifiers SA11 to SA14 connected to a pair of common data lines DL and $\overline{DL}$ and four pairs of bit lines BL11, $\overline{BL11}$ to BL14, $\overline{BL14}$, a current sensing amplifier circuit CSA, which is connected to the pair of common data lines DL and $\overline{DL}$, and a second sensing amplifier SA2 connected between the current sensing amplifier circuit CSA and output terminals DO and $\overline{DO}$.

The first sensing amplifier SA11 includes bipolar transistors B11 and B12, each of which has an emitter commonly connected to the drain of a MOS transistor M1, a base connected to the bit lines BL and $\overline{BL}$ respectively, and a collector connected to data lines DL and $\overline{DL}$ respectively. The first sensing amplifier SA11 further includes a MOS transistor having a gate to which a control signal SAE11 is applied, a drain to which the emitter of the bipolar transistor B11 is connected and a source connected to the ground voltage potential (VSS). The bit lines BL11 and $\overline{BL11}$, which are connected to the bases of the bipolar transistors B11 and B12 respectively, are connected directly or by way of switches to a plurality of memory cells MC for storing data therein. The first sensing amplifiers SA12 to SA14 are similar to the first sensing amplifier SA11 in construction and respectively use control signals SAE12 to SAE14 corresponding to the control signal SAE11, and are connected respectively to pairs of bit lines BL12, $\overline{BL12}$ to BL14, $\overline{BL14}$.

The current sensing amplifier circuit CSA comprises a current-voltage converter circuit IV and two emitter follower circuits EM1 and EM2 and a feedback circuit FB.

The current-voltage converter circuit IV comprises bipolar transistors B21 and B22 which have bases commonly connected to a reference voltage potential Vref, emitters connected to data lines DL and $\overline{DL}$ respectively and collectors connected to a first node N1 and a second node N2 respectively. The current sensing amplifier circuit CSA further comprises resistors R1 and R2, which are connected between a power voltage potential (VDD) and the first and second nodes N1 and N2 respectively, and current sources I11 and I12, which are connected between the ground voltage potential and the bipolar transistors B21 and B22 respectively. It will be understood that the power supply connection is represented by a short horizontal line as shown at the top of resistor R1. That convention is used in these drawings. Another convention used in the figures is that the downward-pointing arrow, at the bottom of transistor M1 for example, denotes VSS.

The emitter follower circuit EM1 comprises a bipolar transistor B31, which has a base connected to the second node N2, a collector connected to the power voltage potential and an emitter connected to a fourth node N4. A current source I13 is connected between the ground voltage potential and the fourth node N4. The emitter follower EM2 comprises a bipolar transistor B32, which has a base connected to the first node N1, a collector connected to the power voltage potential and an emitter connected to a third node N3. A power source I14 is connected between the ground voltage potential and the third node N3.

The feedback circuit FB comprises a bipolar transistor B33 having a base connected to the fourth node, an emitter connected to the drain of an MOS transistor M31 and a collector connected to the first node N1. It also includes a bipolar transistor B34 having a base connected to the third node, N3 an emitter connected to the drain of the MOS transistor 31 and a collector connected to the second node N2. MOS transistor M31 is preferably an MOS type having a gate to which a control signal CSAE is applied and a source connected to the ground voltage potential.

The second sensing amplifier SA2 comprises two CMOS type differential amplifier circuits composed of P-type MOS transistors M11 to M14 and N-type MOS transistors M15 to M18 and an N-type MOS transistor M19 for controlling the operation of the differential amplifier circuits.

One of the differential amplifier circuits comprises MOS transistors M15 and M16 each having a gate connected to the drain of the MOS transistor M11 and a source connected to the drain of a MOS transistor M19, a MOS transistor M11 having a gate connected to the node N3 and a source connected to the power voltage potential, and a MOS transistor M12 having a gate connected to the fourth node N4, a source connected to the power voltage potential and a drain connected to the drain of the MOS transistor 16. The other differential amplifier circuit comprises MOS transistors M17 and M18 each having a gate connected to the drain of the MOS transistor M18 and a source connected to the drain of the MOS transistor M19, a MOS transistor M14 having a gate connected to the fourth node N4 and a source connected to the power voltage potential and a MOS transistor M13 having a gate connected to the third node N3, a source connected to the power voltage potential and a drain connected to the drain of the MOS transistor M17. The second sensing amplifier SA2 further comprises the MOS transistor M19 having a gate to which a control signal SAE2 is applied and a source connected to the ground voltage potential. The drain of the MOS transistor M12 is connected to the output terminal $\overline{DO}$, while the drain of the MOS transistor M13 is connected to the output terminal DO.

The operation of the data reading circuit according to the present invention will be described hereinafter.

At first, a selection circuit, not shown, requires to read out data stored in a specified memory cell MC. The selection circuit supplies a control signal to the first sensing amplifier corresponding to the memory cell MC from which the data is required to be read out at the same time. The first sensing amplifier starts operation when the control signals SAE11 to SAE14 go high (e.g., 5 V).

For example, when one of the memory cells MC connected to the bit lines BL11 and $\overline{BL11}$ is selected, the data stored in the memory cell MC (represented by complementary voltage signals) is supplied to the bit lines BL11 and $\overline{BL11}$. At the same time, the first sensing amplifier SA11 starts operation.

The voltage signals supplied to the bit lines BL11 and $\overline{BL11}$ are transmitted to the bases of bipolar transistors B11 and B12 respectively. Either one of the bipolar transistors B11 and B12 is turned on upon reception of the voltage signal.

The voltage signals supplied to the bit lines BL11 and $\overline{BL11}$ are complementary to each other. That is, when the voltage signal supplied to one of the bit lines is high, that supplied to the other bit line is low. Accordingly, the bipolar transistor is turned on when it receives a voltage signal of high level, while it is turned off when it receives a voltage signal of low level.

We assume that the bit line BL11 receives a voltage signal of high level in the following description.

Since the bipolar transistor BL11 is turned on, an electric current flows from the data line $\overline{DL}$ to the ground voltage potential via the bipolar transistor B11 and the MOS transistor M1. The data lines DL and $\overline{DL}$ are fixedly kept at a given voltage potential level determined by the bipolar transistors B21 and B22 of the current sensing amplifier circuit CSA, the reference voltage potential Vref applied to the bases of the bipolar transistors B21 and B22 and the power sources I11 and I12. As a result, a difference occurs between the currents flowing in the data lines DL and $\overline{DL}$ according to the difference between the voltage potentials of the bit lines BL11 and $\overline{BL11}$. That is, the first sensing amplifier SA11 converts the complementary voltage signals supplied to the bit lines BL11 and $\overline{BL11}$ to complementary current signals and supplies the same to the pair of data lines DL and $\overline{DL}$.

When the electric current flowing in the data line $\overline{DL}$ is increased, the collector current of the bipolar transistor B21 in the current-voltage converter circuit IV is increased. When the collector current is increased, the voltage potential level of the first node N1 drops. The amount of drop in voltage potential level of the first node is determined by multiplying the value of current flowing in the resistor R1 by the value of resistance thereof. On the other hand, since the current flowing in the data line DL does not vary substantially, the voltage potential of the second node N2 is kept substantially as high as the power voltage potential. Accordingly, there occurs a difference between the voltage potentials of the first node N1 and the second node N2 corresponding to the difference between the currents flowing in the data line DL and the data line $\overline{DL}$. That is, the current-voltage converter circuit IV converts the complementary current signals supplied to the data lines DL and $\overline{DL}$ to complementary voltage signals and supplies the same to the first node N1 and the second node N2. The difference between the voltage potentials of the first node N1 and the second node N2 (the amplitude of voltage between the complementary voltage signals) is kept less than 300 mV in case of 1M bit BiCMOS-type SRAM so as to shorten the data reading time.

The voltage potential applied to the first node N1 is transmitted to the base of the bipolar transistor B32 of the emitter follower circuit EM2. Accordingly, the voltage potential of the third node N3 is shifted from that of the first node by the base-emitter voltage Vbe32 of the bipolar transistor B32. Similarly, the voltage potential of the fourth node N4 is shifted from that of the second node by the base-emitter voltage Vbe31 of the bipolar transistor B31. The difference between the voltage potentials of the third node N3 and the fourth node N4 is substantially same as that between the first node N1 and the second node N2. That is, the emitter follower circuits EM1 and EM2 applies the second voltage potential difference, which is generated between the first node N1 and the second node N2 and which is substantially equal to the first voltage potential difference, between the third node N3 and the fourth node N4.

The voltage potential applied to the third node is transmitted to the base of the bipolar transistor B34 of the feedback circuit FB. In the same way, the voltage potential applied to the fourth node is transmitted to the base of the bipolar transistor B33 of the feedback circuit FB. At that time, when the control signal CSAE goes high, the feedback circuit FB starts operation. When the feedback circuit starts operation, the bipolar transistor B33 is turned on. When the bipolar transistor B33 is turned on, the electric current flowing through the first node N1 flows to the ground voltage potential via the bipolar transistor B33 and the MOS transistor M31. As a result, the voltage potential of the first node N1 is further lowered. On the other hand, since the bipolar transistor B34 is kept to be off, the voltage potential of the second node N2 does not vary. The difference between the voltage potentials of the first node N1 and the second node N2 is rapidly increased to the third voltage potential difference by the feedback circuit FB. The third voltage potential difference is larger than the first voltage potential difference generated by the current-voltage converter IV. The voltage potential difference is about 800 mV. That is, the feedback circuit FB detects the complementary outputs of the emitter follower circuit EM1 and EM2 and applies the third voltage potential difference, which is larger than the first voltage potential difference, between the first node N1 and the second node N2.

The emitter follower circuits EM1 and EM2 shift the voltage potentials of the third node N3 and the fourth node N4 according to the voltage potentials of the first node N1 and the second node N2 again. The shifted voltage potentials of the third node N3 and the fourth node N4 are transmitted to the MOS transistors M11 to M14 of the second sensing amplifier SA2. At that time, when the control signal SAE2 goes high, the second sensing amplifier SA2 starts operation. When the second sensing amplifier SA2 starts operation. The MOS transistors M11 and M13 are turned on by the voltage potential level of the third node N3. The MOS transistors M12 and M14 are turned off by the voltage potential level of the fourth node N4. As a result, the output terminal $\overline{DO}$ goes low (substantially at the ground voltage potential), while the output terminal DO goes high (substantially at the source voltage potential). In other words, the difference between the voltage potentials of the third node N3 and the fourth node N4 is rapidly increased to a fourth voltage potential difference by the second sensing amplifier SA2. The fourth voltage potential difference is larger than the second voltage potential difference generated between the third node N3 and the fourth node N4. The fourth voltage potential difference is about 5 V (CMOS logical level). As a result, the second sensing amplifier SA2 detects the complementary outputs of the emitter follower circuits EM1 and EM2 and applies the fourth voltage potential difference (CMOS logical level) between the output terminals DO and $\overline{\text{DO}}$.

What is claimed is:

1. A data reading circuit comprising:
   a first, a second, a third and a fourth nodes;
   a first data line applied to a first current signal having a first current value;
   a second data line applied to a second current signal having a second current value;
   a current-voltage converter circuit connected between said first and second data lines and said first and second nodes for applying a first voltage potential difference between said first node and said second node according to the difference between said first current value and said second current value;
   a level shifting circuit connected between said first and second nodes and said third and fourth nodes for applying a second voltage potential difference, which is substantially equal to said first voltage potential difference between said third node and said fourth node; and
   a feedback circuit connected between said first and second nodes and said third and fourth nodes for applying a third voltage potential difference larger than said first voltage potential difference between said first node and said second node in response to a first control signal.

2. A data reading circuit according to claim 1, wherein said data reading circuit further comprises;
   a first and a second output terminals;
   a first bit line applied to a first voltage signal having a first voltage potential level;
   a second bit line applied to a second voltage signal having a second voltage potential level;
   a first sensing amplifier connected between said first and second bit lines and said first and second data lines for applying a current difference according to the difference between said first voltage potential level and said second voltage potential level between said first data line and said second data in response to a second control signal; and
   a second sensing amplifier connected between said third and fourth nodes and said first and second output terminals for applying a fourth voltage potential difference corresponding to said second voltage potential difference between said first output terminal and said second output terminal in response to a third control signal.

3. A data reading circuit according to claim 2, wherein the voltage potential level applied to said first and second output terminals is a CMOS logic level.

4. A data reading circuit according to claim 1, wherein said current-voltage converter circuit comprises:
   a first transistor having a control electrode connected to a reference voltage potential, a first electrode connected to said first data line and a second electrode connected to said first node;
   a second transistor having a control electrode connected said reference voltage potential, a first electrode connected said second data line and a second electrode connected to said second node;
   a first resistor connected between a first power source having a first power source voltage potential level and said first node;
   a second resistor connected between said first power source and said second node;
   a first constant current source connected between a second power source having a second power source voltage potential level and said first data line;
   a second constant current source connected between said second power source and said second data line;

5. A data reading circuit according to claim 1, wherein said level shifting circuit comprises;
   a third transistor having a control electrode connected to said first node, a first electrode connected to said third node and a second electrode connected to a first power source having a first power source voltage potential level;
   a third constant current source connected between said third node and a second power source having a second power source voltage potential level;
   a fourth transistor having a control electrode connected to said second node, a first electrode connected to said fourth node and a second electrode connected to a first power source; and
   a fourth constant current source connected between said fourth node and said second power source.

6. A data reading circuit according to claim 1, wherein said feedback circuit comprises:
   a fifth transistor having a control electrode connected to said third node, a first electrode connected to said second node and a second electrode connected to a fifth node;
   a sixth transistor having a control electrode connected to said fourth node, a first electrode connected to said first node and a second electrode connected to a fifth node; and
   a seventh transistor having a control electrode to which said first control signal is applied, a first electrode connected to said fifth node and a second electrode connected to a second power source having a second power source voltage potential level.

7. A data reading circuit comprising:
   a plurality of memory cells in which data are stored;
   a first bit line electrically connected to said memory cells and applied to a first voltage signal having a first voltage potential level output by said memory cells;
   a second bit line electrically connected to said memory cells and applied to a second voltage signal having a second voltage potential level output by said memory cells;
   a first data line;
   a second data line;
   a first sensing amplifier connected between said first and second bit lines and said first and second data lines for supplying a first current signal having a first current value corresponding to said first voltage potential level and a second current signal having a second current value corresponding to said second voltage potential level to said first and second data lines respectively;
   a first, a second, a third and a fourth nodes;
   a first and a second output terminals;
   a current-voltage converter circuit connected between said first and second data lines and said first and second nodes for applying a first voltage potential difference, according to the difference between said first and second current values, between said first node and said second node;

a level shifting circuit connected between said first and second nodes and said third and fourth nodes for applying a second voltage potential difference, which is substantially equal to said first voltage potential difference corresponding to said first voltage potential difference, between said third node and said fourth node;

a feedback circuit connected between said first and second nodes and said third and fourth nodes for applying a third voltage potential difference larger than said first voltage potential difference between said first node and said second node in response to a first control signal; and a second sensing amplifier connected between said third and fourth nodes and said first and second output terminals for applying a fourth voltage potential difference larger than said third voltage potential difference between said first output terminal and said second output terminal in response to a second control signal.

8. A data reading circuit according to claim 7, wherein said voltage potential difference applied between said first and second output terminals is CMOS logic level.

9. A data reading circuit according to claim 7, wherein said current-voltage circuit comprises;
- a first transistor having a control electrode connected to a reference voltage potential, a first electrode connected to said first data line and a second electrode connected to said first node;
- a second transistor having a control electrode connected to said reference voltage potential, a first electrode connected to said second data line and a second electrode connected to said second node;
- a first resistor connected between a first power source having a first power source voltage potential level and said first node;
- a second resistor connected between said first power source and said second node;
- a first constant current source connected between a second power source having a second power source voltage potential level and said first data line; and
- a second constant current source connected between said second power source and said second data line.

10. A data reading circuit according to claim 7, wherein said level shifting circuit comprises:
- a third transistor having a control electrode connected to said first node, a first electrode connected to said third node and a second electrode connected to a first power source having a first power source voltage potential level;
- a third constant current source connected between said third node and a second power source having a second power source voltage potential level;
- a fourth transistor having a control electrode connected to said second node, a first electrode connected to said fourth node and a second electrode connected to said first power source; and
- a fourth constant current source connected between said fourth node and said second power source.

11. A data reading circuit according to claim 7, wherein said feedback circuit comprises:
- a fifth transistor having a control electrode connected to said third node, a first electrode connected to said second node and a second electrode connected to a fifth node;
- a sixth transistor having a control electrode connected to said fourth node, a first electrode connected to said first node and a second electrode connected to a fifth node; and
- a seventh transistor having a control electrode applied to said second control signal, a first electrode connected to said fifth node and a second electrode connected to a second power source having a second power source voltage potential level.

* * * * *